US007425728B2

(12) United States Patent
Tsuchiya

(10) Patent No.: US 7,425,728 B2
(45) Date of Patent: Sep. 16, 2008

(54) SURFACE LIGHT SOURCE CONTROL DEVICE

(75) Inventor: Kenshi Tsuchiya, Kumagaya (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 196 days.

(21) Appl. No.: 11/282,648

(22) Filed: Nov. 21, 2005

(65) Prior Publication Data

US 2006/0139299 A1 Jun. 29, 2006

(30) Foreign Application Priority Data

Dec. 24, 2004 (JP) ............................ 2004-374517

(51) Int. Cl.
*H01L 27/15* (2006.01)

(52) U.S. Cl. ............................ 257/83; 257/59; 257/72; 257/257; 257/E27.125

(58) Field of Classification Search .................. 257/57, 257/59, 72, 83, 257, 290, 351, 368
See application file for complete search history.

(56) References Cited

U.S. PATENT DOCUMENTS 5,351,106 A * 9/1994 Lesko et al. .................. 355/83
2004/0227749 A1* 11/2004 Kimura ...................... 345/211
2005/0105009 A1* 5/2005 Dunn et al. .................. 349/21

FOREIGN PATENT DOCUMENTS

JP 11-298044 10/1999

* cited by examiner

*Primary Examiner*—Wai-Sing Louie
(74) *Attorney, Agent, or Firm*—Oblon, Spivak, McClelland, Maier & Neustadt, P.C.

(57) ABSTRACT

A surface light source control device has a plane light source control circuit for setting a current amount to a plurality of diode arrays. The light source control circuit comprises a constant current circuit for holding currents respectively flowing in the plurality of diode arrays constant at the same current value; and a power supply voltage control loop for selecting a notable diode array with a minimum reference voltage, among reference voltages appearing at each terminal of the plurality of diode arrays, appeared thereon to select the minimum reference voltage by a voltage selection circuit and adjusting a common power supply voltage so that the reference voltage becomes a prescribed value.

12 Claims, 4 Drawing Sheets

SURFACE LIGHT SOURCE CONTROL DEVICE

CROSS-REFERENCE TO RELATED APPLICATIONS

This application is based upon and claims the benefit of priority from prior Japanese Patent Application No. 2004-374517, filed Dec. 24, 2004, the entire contents of which are incorporated herein by reference.

BACKGROUND OF THE INVENTION

1. Field of the Invention

The present invention relates to a surface light source control device usable for a liquid crystal display device, and more particularly relates to such a surface light source control device for making a power supply voltage, which is applied to a plurality of arrays of light emitting diodes composing a plane light source section, low in power consumption on the plurality of light emitting diode arrays.

2. Description of the Related Art

Some conventional liquid crystal display devices adopt plane light source sections using light emitting diodes as backlights. Each of these light source sections has a light emitting diode (LED) light source equipped with a plurality of diode arrays with a plurality of LEDs serially arrayed thereon. A power supply voltage with a fixed value is applied to one common terminal of the plurality of LED arrays. Adjusting resistors are connected between the other common terminal and the ground of the plurality of LED arrays, respectively. Then, the display device adjusts adjustment resistors of each LED array so as to pass currents with the same value thereto.

This is because the currents flowing into each LED array vary in accordance with differences of each property of the LEDs. That is, if there are variations in current value among the LED arrays, brightness of each array varies. Moreover, there is a problem in that an excess current flows into each LED array to cause reductions in service life of each LED. Therefore, the display device adjusts the adjustment resistors of each array in order to suppress the variations in the brightness.

As to a technique similar to the above-mentioned technique, a technique using a constant current circuit so as to control a current flowing into the LED is disclosed (See Jpn. Pat. Appln. Publication No. 11-298044). This current circuit controls a current to suppress the variations in brightness in accordance with variations of a surrounding temperature, based on the temperature fluctuation.

However, the foregoing conventional liquid crystal display device needs adjustment operations for the adjustment resistors and requires much time and cost for assembly operations. Since power supply voltages applied to each LED array are usually selected as ones with maximum values which can be applied to each LED array, it is impossible to reduce the power consumption of the diode arrays.

BRIEF SUMMARY OF THE INVENTION

An object of the embodiments of the present invention is to provide a surface light source control device which can set power supply voltages to be applied to a plurality of diode arrays composing a plane light source section to efficient voltage values, does not need adjustment operations and is excellent in operation efficiency.

In an aspect of the present invention, the surface light source control device comprises: a liquid crystal panel having a display area with a plurality of display pixels two-dimensionally arrayed therein; a plane light source section having a circuit board driving the panel and a plurality of diode arrays with a plurality of light emitting diodes (LEDs) serially arrayed thereon; a power supply circuit commonly applying a common power supply voltage to one terminal of the plurality of diode arrays; and a plane light source control circuit connected to the other terminal of the plurality of diode arrays to set a current amount, wherein the control circuit comprises: a constant current circuit connected to the plurality of diode arrays to hold currents respectively flowing therein constant at the same current value; a voltage selection circuit for detecting a notable array on which the lowest minimum reference voltage, among reference voltages obtained after the common power supply voltage applied to the plurality of diode arrays are respectively dropped at the plurality of diode arrays, is appeared to select the lowest minimum reference voltage; and a power supply control loop for reducing the voltage value of the common power supply voltage so that the reference voltage on the notable diode array becomes at least a minimum necessary driving potential of the constant current circuit on the basis of the reference voltage selected by the selection circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
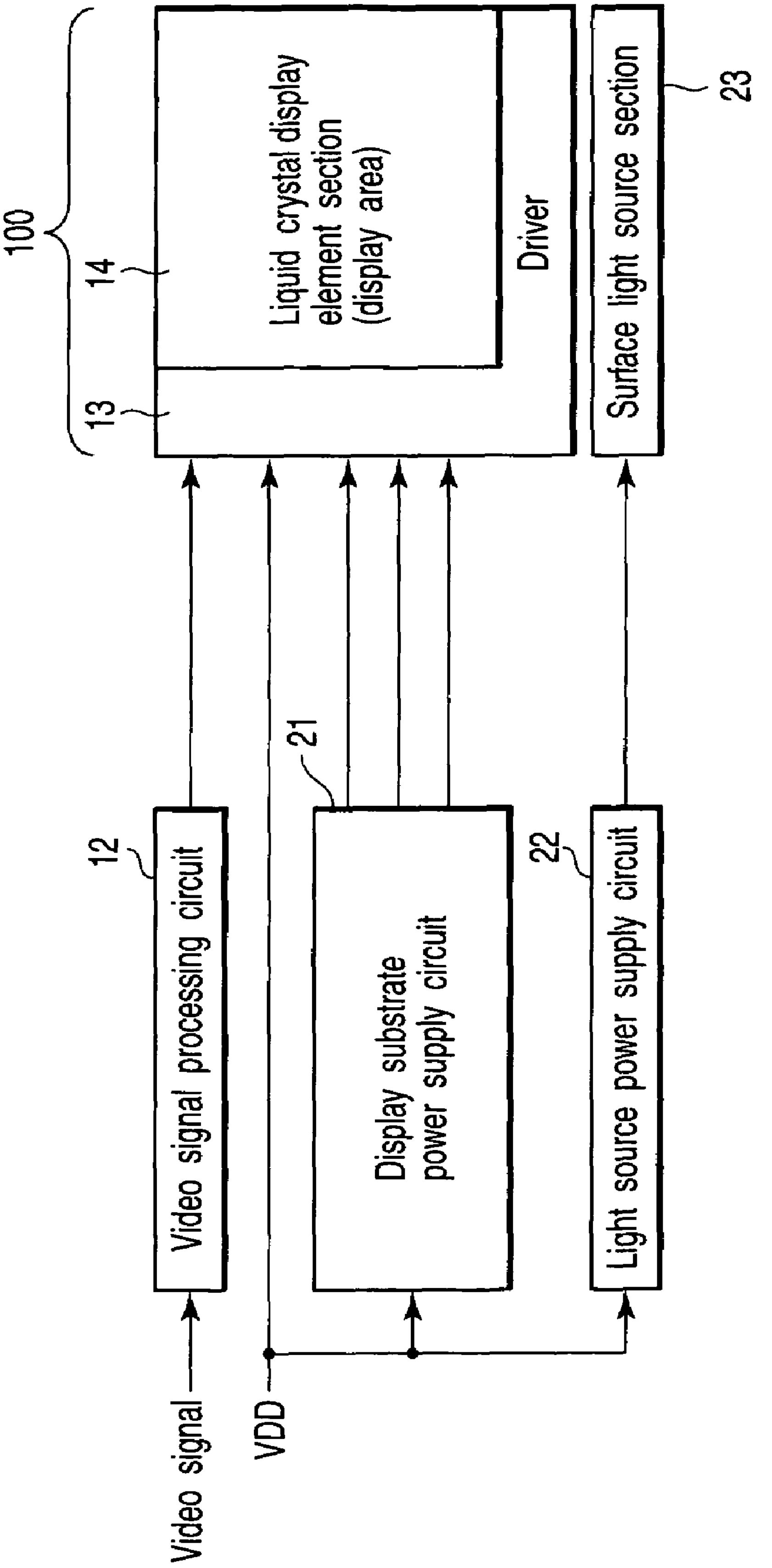
FIG. 1 is a view showing an entire configuration of a liquid display device with the present invention applied thereto.

Hereinafter, embodiments of the present invention will be described in detail with reference to the drawings. FIG. 1 shows a schematic configuration of a liquid crystal display device. In a liquid crystal display element section (also referred to as a display area) 14 formed on a transparent glass substrate included in a liquid crystal panel 100, pixels including thin film transistors, pixel electrodes, auxiliary capacitor and the like are two-dimensionally arrayed. And a plurality of signal lines are formed in vertical directions and a plurality of scanning lines are formed in horizontal directions and the pixels are respectively arranged in the vicinity of points at which the plurality of signal lines and scanning lines are intersected. Furthermore, a driver 13 including a scanning line drive circuit and a signal line drive circuit is arranged around the display element section 14.

A pixel signal from a video signal processing circuit 12 is supplied to the signal line drive circuit of the driver 13. The signal line drive circuit latches the pixel signal of one scanning line supplies it all together to pixels on one scanning line specified by the scanning line drive circuit. In this way, the display device can form an image in the display area by taking in the pixel signals of one scanning line sequentially into the signal line drive circuit and by specifying writing in lines in the display area in accordance with a frame period by the scanning line drive circuit.

At this point, a display substrate power supply circuit 21 generates power supply voltages for the signal line drive circuit, the scanning line drive circuit, etc., and a power supply voltage for a common electrode (not shown). A light source power supply circuit 22 generates a power supply voltage of a surface light source section 23. The light source section 23 is used as a backlight of the display element section 14.

Figure 2:
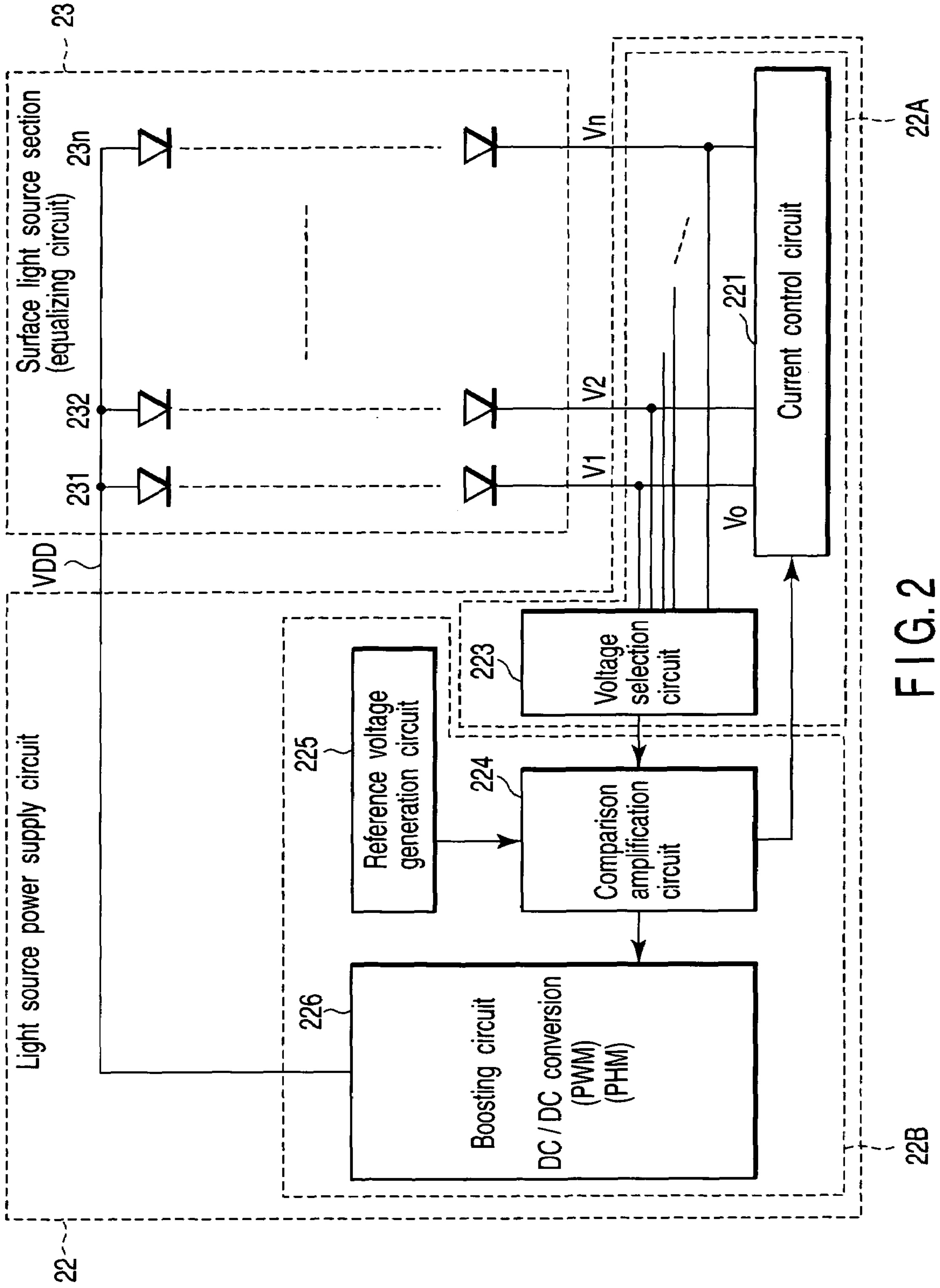
FIG. 2 is a view showing an configuration example to be a substantial section of the present invention.

FIG. 2 shows a configuration example of the above-described surface light source section 23 and the light source power supply circuit 22.

The light source section 23 is a plane light source section having a so-called LED light source composed of diode arrays 231, 232 to **23*n*** with a plurality of LEDs serially connected thereon.

Here, the power supply circuit 22 has a power supply circuit 22B to apply common power supply voltages in common to one terminal of the plurality of diode arrays 231, 232 to **23*n* and a plane light source control circuit 22A to be connected to the other terminal of the plurality of diode arrays 231, 232 to 23*n*** to set a current amount.

At this point, the control circuit 22A has a constant current circuit (current control circuit) 221 connected to the plurality of diodes arrays to hold currents respectively flowing into the plurality of diode arrays constant at the same current value. The control circuit 22A further has a voltage selection circuit 223. This selection circuit 223 detects a notable diode array with the lowest minimum reference voltage, among the reference voltages V1, V2 to Vn obtained after the common power supply voltage VDD applied to the plurality of diode arrays are respectively dropped on the plurality of diode arrays 231, 232 to **23*n*, appearing thereon to select the minimum reference voltage. Further, a power supply voltage control loop is provided. The control loop includes a comparison amplification circuit 224, a reference voltage generation circuit 225 and a boosting circuit 226. The control loop adjusts and reduces the voltage value of the common power supply voltage VDD so that the reference voltage of the notable diode array becomes at least a drive potential V0 of a necessary minimum of the constant current circuit 221. The reference voltage selected by the selection circuit 223 is compared with a reference voltage of the generation circuit 225 of the amplification circuit 224 and its error is applied to the control terminal of the boosting circuit 226. The boosting circuit 226** is a DC/DC converter, for example, a pulse width modulation (PWM) method and a pulse height modulation (PHM) method are adopted therein, and can finely adjust an output power supply voltage in accordance with the control voltage applied to the control terminal.

Figure 3:
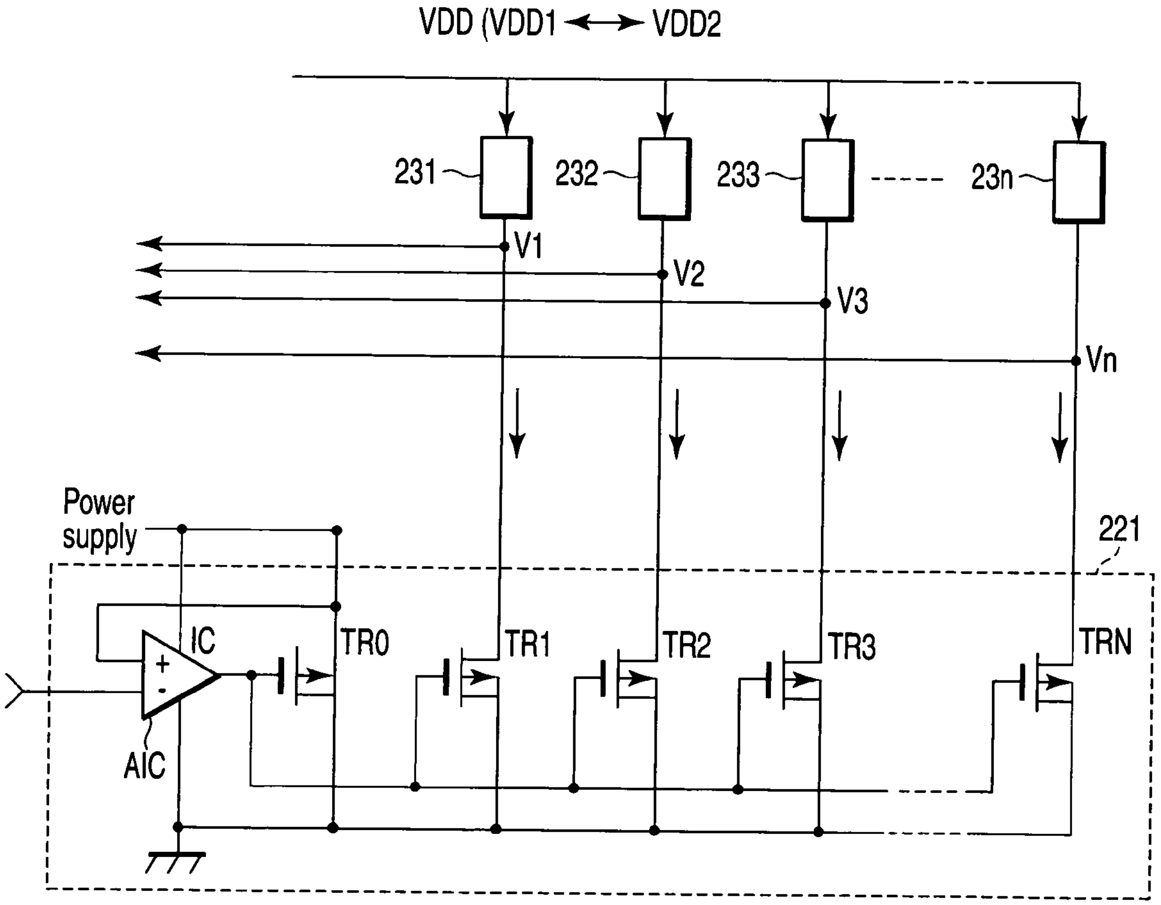
FIG. 3 is a view showing a part of a current control circuit 221 in FIG. 2, in detail.

FIG. 3 further shows a relation between the surface light source section 23 and the current control circuit 221. In the current control circuit 221, each diode array is serially connected to transistors TR1, TR2, TR3 to TRN, respectively.

A source of transistor TR0 is connected to a power supply via a resistor and connected to a positive feedback terminal of an amplifier AIC. A constant voltage is input to a negative feedback input terminal of the amplifier AIC and a state of transistor TR0 is given by the values of the constant voltage and the resistor. Each gate and source of transistors TR1, TR2 to TRN is connected to the gate and source of transistor TR0 to become a circuit in which the same currents are flowed. It goes without saying for the transistors from transistor TR1 up to transistor TRN to be made same in property. And on this time, the current control circuit 221 uses the transistors brought from the same package, namely, manufactured in the same wafer in similar conditions.

Hereinafter, operations of the above-mentioned embodiment will be explained. Each diode varies individually. Thereby, all of the plurality of diode arrays 231, 232 to **23*n* do not necessarily have the same resistance. Therefore, even if the control circuit 221 is designed to flow a prescribed constant current therein, the output voltages (reference voltages) from the diode arrays 231, 232 to 23*n* are different sometimes. Because each voltage drop at the diode arrays 231, 232 to 23*n* are different with one another. Now, it is assumed that a voltage VDD1** is applied as a common power supply voltage. Then, the following formulas are given.

$$V1 = VDD1 - (\text{voltage drop at diode array 231})$$

$$V2 = VDD1 - (\text{voltage drop at diode array 232})$$

$$V3 = VDD1 - (\text{voltage drop at diode array 233})$$

to $$Vn = VDD1 - (\text{voltage drop at diode array } 23n)$$

Here, the selection circuit 223 selects the smallest reference voltage. This selection is achieved by comparing each reference voltage. It is assumed that the smallest reference voltage is V1.

If the value of the smallest reference voltage is the reference voltage V0 necessary to drive the constant current circuit 221, the common power supply voltage VDD1 is not required to be adjusted. However, if the selected reference voltage is larger than the reference voltage V0, the difference Vx may be subtracted from the voltage VDD1. That is, a common power supply voltage VDD2 may be set as follows.

$$VDD1 - Vx = VDD2$$

A feedback loop to set the VDD 2 is the foregoing control loop. As a result, the display device according to the embodiment uses a necessary minimum voltage least in waste as the common power supply voltage VDD. Accordingly, this display device regarding the embodiment can set the power supply voltage to apply to the plurality of diode arrays composing the plane light source section to an efficient voltage value, reduce the power consumption, eliminate the need of adjustment operations, and make efficient in operation and effective in cost reduction.

In the above-mentioned display device, it is assumed that the number of serially connected light emitting diodes is eight and the number of the diode arrays is five so as to obtain center luminance of 4,000 candelas. Here, if it is assumed that currents of 20 mA are flowed to each individual diode array, individual diode arrays cause variations in voltage from 3.2 to 4.0 V as the power supply voltages VDD. These variations are resulted from difference in property of each diode. Conventionally, in a system for adjusting individual diode, the resistances serially connected to each diode array are adjusted. Moreover, the conventional system has used a maximum voltage of 4.0 V as a power supply voltage for the maximum variation in diode properties and adopted it as the common power supply voltage.

Conversely, the embodiment of the present invention is configured that a necessary minimum common power supply voltage is automatically set as the common power supply voltage. Therefore, the display device regarding the embodiment can reduce the consumption power and useless adjustment operations.

The present invention is effective to be applied to a liquid crystal display unit for a TV receiver, a personal computer, a mobile phone, an on-vehicle indicator and the like. The present invention is not limited to the above-described embodiment and a variety of modified embodiments are available. The control circuit 221 may switch the current value and also make variable when setting a current of a constant current source. This modified embodiment can be adopted for a brightness adjustment of a screen. In this case, a necessary minimum voltage value is automatically set as a common power supply voltage.

The present invention may be made as a device, the operation period of which is limited, in a manner such that the device is operated when power is supplied thereto or operated for a prescribed time period when the brightness adjustment of the entire screen is performed, as timing of setting the common power supply voltage. Alternatively, the foregoing surface light source control operation may be performed, by following the brightness adjustment.

Moreover, in the above-mentioned embodiment, the control circuit 221 is disposed on the ground sides of diode arrays. However, the control circuit 221 may be disposed on the common power supply voltage sides of the diode arrays. In this case, the selection circuit 223 selects the highest voltage among the voltages appeared on the plurality of diode arrays.

Figure 4:
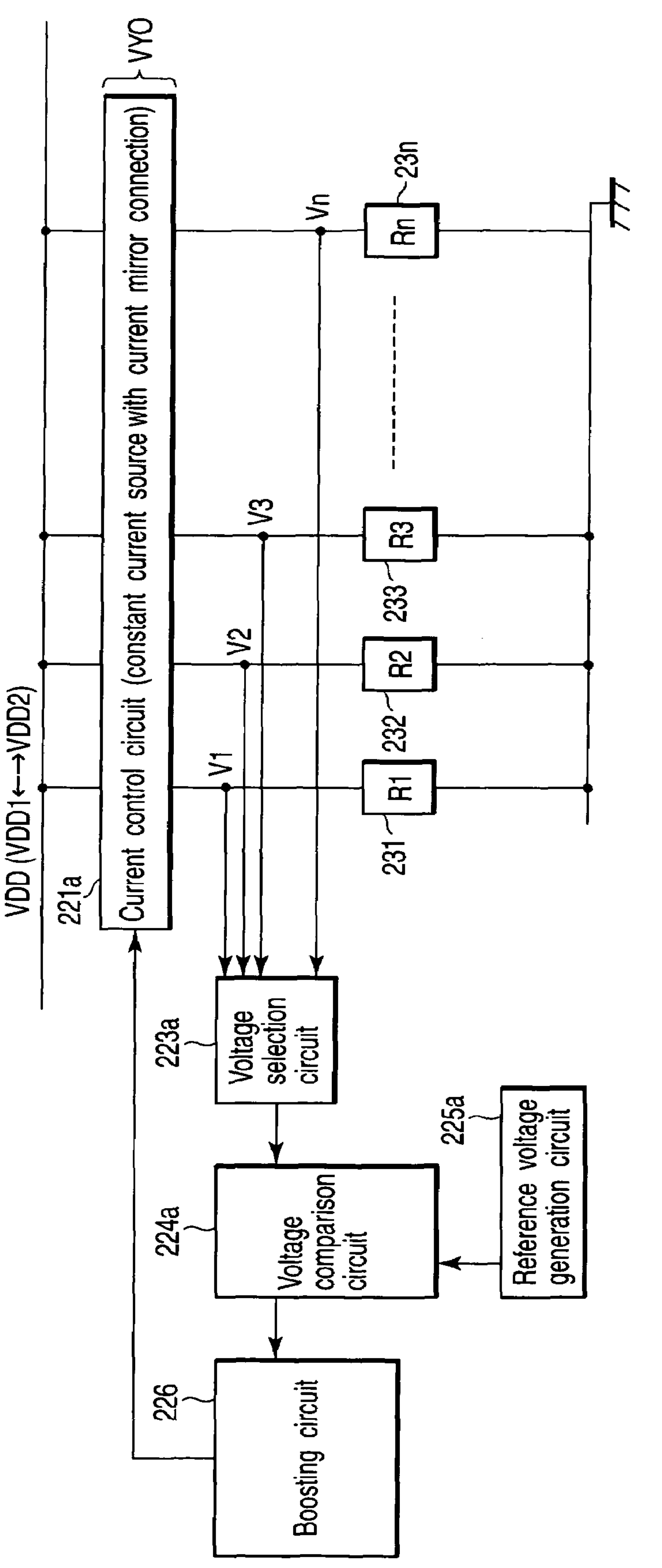
FIG. 4 is a view showing another embodiment of the present invention.

FIG. 4 shows another embodiment of the present invention. Terminals on power supply sides of the plurality of diode arrays 231, 232 to 23*n* are connected to a common power supply voltage VDD line through a current control circuit 221*a*. Terminals on the power supply sides of the plurality of diode arrays 231, 232 to 23*n* are connected to a voltage selection circuit 223*a*. Now, it is assumed that the voltage V1 is a maximum one in a state that the common power supply voltage VDD1 is given. If the voltage difference VY1 between the voltage V and the voltage VDD1 is equal to the value (VDD−VY0) in which the voltage drop of VY0 of the control circuit 221*a* is subtracted from the voltage VDD, it is suggested that the voltage VDD1 is appropriate for this embodiment. However, if the voltage difference VY1 is expressed in the following formula: VY1>VDD−VY0, it is suggested that a voltage more than necessity is used. Therefore, the voltage equivalent to the voltage difference VY1 is output from a voltage comparison circuit 224*a* to control a boosting circuit 226 and lowers the voltage VDD to the voltage VDD2. Thereby, a formula: VY1=VDD2−VY0 is roughly established. This state is one in which the display device is driven in low power consumption.

The present invention is not limited to the specific embodiments thereof, it is to be understood that the embodiments will be achieved by modifying the constituent elements without departing from the sprit or scope of the invention, in those implementation phases. A variety of inventions can be formed by appropriate combinations of a plurality of constituent elements disclosed in the above-described embodiments. For example, some of the constituent elements may be eliminated from entire constituent elements shown in the embodiments. Moreover, constituent elements regarding different embodiments may be appropriately combined.

According to the foregoing means in the embodiment, the present invention can set the power supply voltage to be applied to the plurality of diode arrays composing the plane light source section to the efficient voltage value, reduce the power consumption, eliminate the need of the adjustment operations, and make efficient in operation and effective in cost reduction.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A surface light source control device comprising:

a liquid crystal panel having a display area with a plurality of display pixels two-dimensionally arrayed therein;

a plane light source section having a circuit board driving the panel and a plurality of diode arrays with a plurality of light emitting diodes LEDs serially arrayed thereon;

a power supply circuit commonly applying a common power supply voltage to one terminal of the plurality of diode arrays;

a constant current circuit connected to the other terminal of the plurality of diode arrays to hold currents respectively flowing to each of the diode arrays constant so that the currents have the same current value;

a voltage selection circuit for detecting a notable array with the lowest minimum reference voltage, among reference voltages obtained after the common power supply voltage applied to the plurality of diode arrays are respectively dropped at the plurality of diode arrays, appearing thereon to select the lowest minimum reference voltage; and a power supply control loop for adjusting a voltage value of the common power supply voltage so that the reference voltage selected by the selection circuit becomes a prescribed value.

2. The device according to claim 1, wherein the control loop reduces the voltage value of the common power supply voltage so that the reference voltage of the notable diode array becomes at least a necessary minimum drive voltage in the current circuit.

3. A surface light source control device, comprising:

a liquid crystal panel having a display area with a plurality of display pixels two-dimensionally arrayed therein;

a circuit substrate for driving the panel;

a plane light source section having a plurality of diode arrays with a plurality of LEDs serially arrayed thereon;

a power supply circuit for commonly supplying a common power supply voltage to one terminal of the plurality of diode arrays;

a constant current circuit connected between the other terminal of the plurality of diode arrays and a line of the common power supply voltage to hold currents respectively flowing in the plurality of diode arrays constant at the same current value;

a voltage selection circuit for detecting a notable diode array with the highest maximum reference voltage, among the reference voltages obtained after the common power supply voltage applied to the plurality of diode arrays are respectively dropped in the current circuit of each diode array, appearing thereon to select the maximum reference voltage; and a power supply voltage control loop for adjusting a voltage value of the common power supply voltage so that a difference between the reference voltage selected by the selection circuit and the common power supply voltage becomes a prescribed value.

4. The device according to claim 2, wherein the control loop reduces the voltage value of the common power supply voltage so that the reference voltage of the notable diode array becomes the same value as a value that is made by subtracting a potential drop in the current circuit from the common power supply voltage.

5. The device according to claim 1, wherein operations of the selection circuit and the control loop are set so as to operate for a prescribed time period after power is supplied to the device.

6. The device according to claim 1, wherein operations of the selection circuit and the loop are set so as to operate by following when a brightness adjustment of a whole screen is performed.

7. The device according to claim 3, wherein operations of the selection circuit and the loop are set so as to operate for a prescribed time period after power is supplied to the device.

8. The device according to claim 3, wherein operations of the selection circuit and the loop are set so as to operate by following when a brightness adjustment over an entire screen is performed.

9. A surface light source control method which comprises a liquid crystal panel having a display area with a plurality of display pixels two-dimensionally arrayed therein; a plane light source section having a circuit board driving the panel and a plurality of diode arrays with a plurality of LEDs serially arrayed thereon; a power supply circuit commonly applying a common power supply voltage to one terminal of the plurality of diode arrays; and a constant current circuit connected to the other terminal of the plurality of diode arrays to hold currents respectively flowing to each of the diode arrays constant so that the currents have the same current value and to control the plane light source section, comprising:

detecting a notable diode array with the lowest minimum reference voltage, among reference voltages obtained after the common power supply voltage applied to the plurality of diode arrays are respectively dropped at the plurality of diode arrays, appearing thereon to select the lowest minimum reference voltage by a voltage selection circuit; and adjusting a voltage value of the common power supply voltage so that the reference voltage selected by the selection circuit becomes a prescribed value.

10. The method according to claim 9, wherein a voltage value of the common power supply voltage is reduced so that the reference voltage of the notable diode array becomes at least a necessary minimum drive voltage in the current circuit.

11. The method according to claim 9, wherein operations of the selection circuit and the control loop are set to operate for a prescribed time period after power is supplied to a surface light source control device.

12. The method according to claim 9, wherein operations of the selection circuit and the control loop are set so as to operate by following when a brightness adjustment over an entire screen is performed.

* * * * *